United States Patent [19]

Morioka et al.

[11] Patent Number: 4,670,176

[45] Date of Patent: Jun. 2, 1987

[54] SINGLE CRYSTAL OF COMPOUND SEMICONDUCTOR OF GROUPS III-V WITH LOW DISLOCATION DENSITY

[75] Inventors: Mikio Morioka; Atsushi Shimizu, both of Hyogo, Japan

[73] Assignee: Sumitomo Electric Industries, Ltd., Osaka, Japan

[21] Appl. No.: 714,552

[22] Filed: Mar. 21, 1985

[30] Foreign Application Priority Data

Mar. 26, 1984 [JP] Japan .................................. 59-58881

[51] Int. Cl.$^4$ ........................ C04B 35/00; H01B 1/02; H01B 1/06

[52] U.S. Cl. ............................. 252/62.3 GA; 252/512; 252/518; 252/623 R; 357/61; 357/63; 148/33; 148/33.1

[58] Field of Search .......... 252/518, 62.3 GA, 62.3 C, 252/62.3 R; 357/59, 61, 63; 423/592, 601, 624, 593, 303, 305, 306; 148/33, 33.1

[56] References Cited

U.S. PATENT DOCUMENTS 3,496,118 2/1970 Willardson et al. .
4,409,134 10/1983 Yamazaki ............................ 252/518

FOREIGN PATENT DOCUMENTS 154771 8/1958 Japan .
104796 8/1981 Japan .
58-19637 4/1983 Japan .

OTHER PUBLICATIONS

Mil'Vidsky et al., "Effect of Doping on Formation of Dislocation Structure in Semiconductor Crystals", Journal of Crystal Growth 52(1981) 396–403.
Jacob et al., "Dislocation-Free GaAs and InP Crystals by Isoelectronic Doping", Journal of Crystal Growth 61(1983) 417–424.

Primary Examiner—Josephine L. Barr
Attorney, Agent, or Firm—Cushman, Darby & Cushman

[57] ABSTRACT

More than two impurities are doped in a host crystal of compound semiconductors. One of the impurities is an anisoelectronic impurity. One or more than one impurities are isoelectronic impurities. The anisoelectronic impurity determines the electronic property and the carrier density of the semiconductor. Isoelectronic impurity does not change the electronic property. But isoelectronic impurity has an effect of impurity hardening.

The impurity atom forms a covalent bond with a host atom. The bond length between an impurity and a host atom differs from the standard bond length between host atoms. Although the real bond lengths between an impurity atom and a host atom cannot be measured, the Inventors think the difference of bond lengths generate dislocation or other lattice defects of crystal. The real bond length "A" between an impurity and a host atom in an impurity-doped crystal may be surmized from the corresponding bond length "a" or "b" in a two-component crystal consisting of the impurity element and the host element.

Definite and measurable bond length "a" or "b" replaces the real unknown bond length "A". The impurity whose replaced bond length "a" or "b" is larger than the standard bond length "$a_0$" between host atoms is called an over-impurity. The impurity whose replaced bond length "a" or "b" is smaller than "$a_0$" is called an under-impurity. At least one under-impurity and at least one over-impurity must be doped. The arithmetic average "$\bar{a}$" of the bond lengths between the impurity atoms and the host atoms should not differ from "$a_0$" by more than 1%. Size effects of under- and over-impurities compensate each other in the double-impurity-doped crystal. Dislocations or other lattice defects are reduced.

9 Claims, 3 Drawing Figures

SINGLE CRYSTAL OF COMPOUND SEMICONDUCTOR OF GROUPS III-V WITH LOW DISLOCATION DENSITY

BACKGROUND OF THE INVENTION

(a) Field of the Technology

This invention relates to a single crystal of compound semiconductor of groups III-V with low dislocation density.

The elements of group III on the periodic table are B, Al, Ga, In, etc. The elements of group V are N, P, As, Sb, etc. Semiconductors consisting of these elements are GaAs, InSb, GaP, GaSb and other compounds.

Compound semiconductors of groups III-V are used as substrates for field effect transistors, integrated circuits including them, light emitting devices, light detecting devices or various optical integrated circuits.

Dislocation density signifies the numbers of dislocation of lattices in a single crystal in a unit volume. Dislocation density is frequently represented by EPD (Etch Pit Density). A single crystal is sliced into thin wafers. A wafer is then etched with a pertinent etchant which reveals superficial dislocations as etch pits. EPD is defined as a number of etch pits per unit area. An operator counts the number of etch pits in a definite area on a wafer through a microscope and calculates EPD by dividing the number by the area.

Although EPD is one of the practical representations of dislocation density, the terms EPD and dislocation density have the same meaning in this specification.

It is desirable that dislocation density is low, and the distribution of dislocation density is uniform in a wafer. It may be best, that the distribution of dislocation density is uniform throughout a single crystal ingot.

However, for instance, GaAs single crystals grown by conventional LEC method (Liquid Encapsulated Czockralski Method) have a great many dislocations. EPD is usually 50,000 to 100,000 $cm^{-2}$.

The LEC method is one of the pulling methods for crystal growth. A single crystal is pulled up into $B_2O_3$ from a material melt. The temperature gradient in the crystal is very large near the solid-liquid interface. Big thermal stress is generated and great thermal distortions occur because of this stress. Prevailing thermal distortions multiply dislocations in the single crystal.

The HB method (Horizontal Bridgman Method) is one of the boat methods for crystal growth. It uses a boat containing material melt and grows a single crystal by changing the temperature distribution in a horizontal direction. This method can make a single crystal with a low EPD, since it has so high a degree of freedom for controlling temperature distributions. The generation of thermal stress is reduced.

However a single crystal made by the HB method does not have a round section. The section resembles the character "D". Large parts of a crystal are wasted in a grinding process to make round wafers.

Besides, because the HB method uses a quartz boat, the grown crystal is apt to include silicon. Therefore the crystals grown by the HB method have low resistivity in general. To obtain semi-insulation which is an indispensable characteristic for FET substrates, we must dope Cr, etc. into a crystal.

This invention has a wide applicability for any methods for growing a single crystal of compound semiconductors. Namely it is fully applicable to LEC method, HB method and other methods.

(b) Impurity Hardening

Most pure metals are soft and weak. Hardness and stickiness of metals are heighten by adding impurities. For example, carbon is added to iron to harden it. An alloy is made by mixing different metals.

With regard to compound semiconductors some trials were done to harden crystals and to reduce dislocation density by doping impurities.

In the U.S. Pat. No. 3,496,118 (patented on Feb. 17, 1970), Willardson et al. insisted that impurity doping of Te, Sb, Bi, Pb etc. into a compound semiconductor is effective to heighten electron mobility in the compound semiconductors belonging to groups III-V. Willardson et al. chose impurities whose distribution coefficient is less than 0.02.

In the journal of the Crystal Growth 52 (1981) p. 396–403, Mil'vidsky et al. asserted that they had discovered the fact that EPD was drastically reduced by doping about $10^{19}$ $cm^{-3}$ of Te, In, Sn, etc., when a GaAs single crystal was grown by an LEC method. The best impurity was Te. They reported they had grown a GaAs single crystal of 20 to 25 mm in diameter by doping Te and EPD in the grown crystal at about $10^2$ $cm^{-2}$.

Regarding why impurity-doping reduces EPD, Mil'vidsky et al. explained that impurity-doping raised a critical shear stress in a crystal and high critical shear stress suppressed occurences of dislocations.

In the Journal of Crystal Growth 61, (1983) p. 417–424, Jacob et al. reported the results of experiments wherein single crystals of GaAs or InP were grown by an LEC method with impurity doping of P, B, In or Sb. Grown crystals were very small crystals whose diameter is 15 to 25 mm. To doped In, compound InAs was doped into GaAs. To dope Sb, elements Sb or compound GaSb was doped into GaAs. According to their experiment, In concentrations in crystal were 7, 11 and $13 \times 10^{19}$ $cm^{-3}$. They wrote concerning the former two specimens that the upper two third of the crystals was single-crystallized, and concerning the last specimen only the upper one fifth of the crystal was single-crystallized. Besides, they reported that the EPD of the single crystal regions were less than $10^2$ $cm^{-2}$.

In addition Jacob et al. wrote impurity doping of P or B into GaAs crystal never reduced EPD at all.

Several experiments for growing single crystals of GaAs or InP doped with impurities by more than $10^{19}$ $cm^{-3}$ have been done.

They call the phenomenon "impurity hardening". But it is questionable whether this term is appropriate.

Concerning the questions why EPD is reduced by the existence of some impurities and why other impurities are totally unable to reduce EPD, present explanations do not satisfy the inventors.

In all the experiments one impurity was doped intentionally. In practice more than one impurity has been included in a single crystal, but these impurities were included in the material and were not eliminated by a refining process.

There is neither report nor publication concerning a single crystal doped with more than two impurities intentionally.

(c) Isoelectronic Impurity

Because Te, Pb, Si and Cr are not the elements of group III or group V, the electronic property of compound semiconductors of groups III–V is changed by doping with these impurities.

On the contrary doping with the elements of group III, e.g. B, Al, Ga and In or doping with the elements of group V, e.g. N, P, As and Sb does not change the electronic property of compound semiconductors of groups III–V, because doped impurity atoms are apt to replace the lattice sites which should be occupied by elements of a host crystal having the same valence number. To distinguish impurities from main compound elements, the main elements composing the crystal are called "host elements", and the crystal to be doped with impurities is called "host crystal" in this specification.

These impurites which do not change the electronic property of a host crystal are called "isoelectronic impurities". Practical definition of isoelectronic impurity is an impurity which is doped into a compound semiconductor of groups III–V and is an element belonging to group III or group V besides the host elements.

On the contrary the impurities Si, Zn, Sn, S, Te, Cr, Pb, etc., which do not belong to group III nor to group V have electronic activities in compounds of groups III–V. These impurities are called anisoelectronic impurities in this specification.

(d) Coordination of Lattice Constants

Mixed compound semiconductors are usually made of an epitaxy which forms and an active layer upon a substrate of compound semiconductor belonging to the same groups. In this case the coordination of lattice constants between the substrate and the epitaxial growth layer is a serious problem.

For example, when an epitaxial growth layer of mixed semiconductor InGaAsP is grown upon an InP substrate, the difference of lattice constants between InP and InGaAsP should be coordinated to be less than 0.2%.

Here InGaAsP is a simplified representation of a mixed semiconductor consisting of In, Ga, As and P. A rigorous representation may be $In_{1-x}Ga_xAs_yP_{1-y}$. The lattice constant varies as a function of component ratios x and y. However the component ratios are omitted for simplification herein.

When an epitaxial layer of mixed compound GaAlAs is grown on a GaAs substrate the allowable maximum difference of lattice constants is 0.26%.

To grow an epitaxial layer upon a substrate, the coordination of lattice constants between the epitaxial layer and the substrate is decisively important.

The difference of lattice constants would generate misfit dislocations at the boundary between substrate and epitaxial layer. The misfit dislocations would propagate into an epitaxial layer and multiply dislocations in the layer.

Besides epitaxy, coordination of lattice constants is important also for pulling of a single crystal.

For example, when a single crystal of mixed compound InGaSb is grown by a pulling method using a GaSb seed crystal, micro cracks occur in an InGaSb single crystal, if there is a difference of lattice constants between the GaSb seed crystal and the pulled InGaSb crystal.

Therefore the coordination of lattice constants between two crystals is an absolute requirement, when one crystal succeeds to another crystal whose components differ from the former one at a definite boundary.

(e) Problem of Segregation Incurred by an Impurity Doping

Jacob's impurity-doped single crystals of compound semiconductors aforementioned had serious difficulties, although EPD were greatly reduced in a confined region of the crystals.

Considerable amount of an impurity must be doped to reduce EPD. As the distribution coefficient of an impurity is either more than 1 or less than 1, the impurity concentration changes to a great extent while a single crystal is pulled upward.

In may cases distribution coefficients are much less than 1. In this case the impurity is condensed in a melt while crystal growth progresses. Therefore impurity concentration in a grown crystal is lowest at a front end (which is connected with a seed crystal) and highest at a back end (which is farthest from a seed crystal and is pulled last).

If the impurity concentration in a crystal is high, for example, 10% even at the front end, the pulled crystal cannot become a single crystal at the back end where the impurity is concentrated. Near the back end impurity segregation occurs on the surface of the crystal. Poly-crystal or crystal with impurity segregation cannot be used as substrates for electronic devices.

Although Jacob pulled up very small crystals which were 15 to 25 mm in diameter, he reported that the lower one third to two third regions of the crystal were non-single in the case of high impurity doping.

Occurence of thermal distortions in a semiconductor crystal is supposed to be in proportion to the second to the third power of the diameter.

Wafers must be at least two inches in diameter to be practically used for industrial purposes. Production of such wide wafers is supposed to be several times as difficult as that for small wafers of 15 to 25 mm in diameter.

We think the production of the low EPD single crystal is meaningless in practice, because the single crystal is 20 mm in diameter and the region without dislocation is only the upper small part near the seed crystal.

For example in the case of In doping to a GaAs host crystal, a good amount of doping of In causes localized segregation of In (facet phenomenon, striation or supercooling), which bring about nonuniformity of component ratios in the In-doped GaAs single crystal. At these regions lattice misfit occurs.

As In is condensed, In segregation occurs and crystal becomes non-single. Such an impurity segregation near a back end of a crystal also occurs in the case of Sb doping into a GaAs host crystal.

To reduce EPD in a crystal, a great amount of impurity must be doped. But if the impurity concentration is high, the crystal becomes poly-crystal and impurity segregation occurs near the back end of the crystal.

There is no generally-accepted explanation of the impurity segregation and the beginning of poly-crystallization.

The Inventors suppose it is because an effective diameter of an impurity element is larger than that of a host element of the same groups which the impurity should replace.

For example consider the case of In doping in GaAs. If and In atom replaces a Ga atom at a Ga site, the bond length of In-As is supposed to be longer than the bond length of Ga-As, because the effective diameter of In is larger than that of Ga.

Although it may be a very microscopic change, the size of lattices including an In atom is apt to become bigger than that of other lattices consisting of only host elements. If the amount of doped In is big, the effects of excess sizes of lattices will be so much that macroscopic lattice misfits occur and the structure of a single crystal is destroyed.

We don't know how long the bond length of In-As in a GaAs single crystal is in practice. The bond length of In-As would vary as a function of the concentration of In. The bond length must differ from the bond length of Ga-As. Also the bond length of In-As would differ from the bond length of In-As in an InAs single crystal.

We suppose the bond length of In-As in a GaAs single crystal would probably be a middle value between the bond length of Ga-As in a GaAs single crystal and the bond length of In-As in an InAs single crystal.

Unlike the impurities In and Sb, the other impurities, B, N, P and Al in a GaAs host crystal have an effective radius smaller than that of the host elements. A similar assumption would hold in the case of the smaller impurities.

If an impurity element B in a GaAs crystal replaces a Ga site of a lattice, the bond length of B-As would be shorter than the bond length of Ga-As in the host crystal but longer than the bond length of B-As in a BAs crystal.

(f) Microscopic Lattice Coordination

If the impurity segregation on the bottom part of a GaAs single crystal by doping an impurity In or Sb is generated from macroscopic excess of lattice constant of an impurity-doped crystal, doping of a smaller impurity B or N would compensate for the excess of lattice constant.

Of course an impurity-doped crystal has no distinctive boundaries which might divide the lattices consisting only of host elements from the lattices including impurity elements unlike an epitaxial layer grown on a substrate of a single crystal grown from a seed crystal. Therefore the lattice misfit in an impurity-doped crystal will differ from the lattice misfit in these matters.

However small regions can be imagined with pertinent volumes in an impurity-doped crystal. The crystal can be considered to be divided into the imaginary small regions. Some imaginary small regions have no impurity. Other imaginary small regions have one impurity. Other imaginary regions have two impurities, and so on.

In an impurity-doped crystal the various kinds of small regions adjoin one another. Lattice coordination would be required on the boundaries also.

If the requirement of lattice coordination was imposed upon the boundaries between imaginary small regions, the requirements would be satisfied by doping two kinds of impurities in a host crystal. For example host elements are Ga and As in the case of a GaAs single crystal. In this specification the impurities which are apt to make a bond longer than the host bond of Ga-As by coupling with one of host elements are called "over-impurities". And we call the impurities which are apt to make a bond shorter than the host bond of Ga-As by coupling with one of host elements "under-impurities".

For example, with regard to a GaAs host crystal, B, N, Si and Cr are under-impurities. Sb, In and Zn are over-impurities.

In the case of an InAs host crystal, B, N, Ga, P, Al, Zn, S and Sn are under-impurities. Sb is an over-impurity.

It is assumed that the impurities would be replaced on the corresponding lattice sites in a crystal.

The bond length between host elements is denoted by $A_0$. The bond length between an under-impurity and a host element is denoted by $A_1$. The bond length between an over-impurity and a host element is denoted by $A_2$.

For example when N and In are doped as impurities into a GaAs crystal, $A_0$ is a bond length of Ga-As, $A_1$ is a bond length of N-Ga and $A_2$ is a bond length of In-As.

We consider the change of the length of a side of an imaginary small region. In a small region, $N_0$ is a number of host pairs Ga-As, $N_1$ is a number of under-impurity atoms, $N_2$ is a number of over-impurity atoms, $u_1$ is a quotient of $N_1$ divided by $N_0$, and $u_2$ is a quotient of $N_2$ divided by $N_0$.

The length "l" of a side of a small region is given by $$l = (1 - u_1 - u_2) + \frac{A_1}{A_0} u_1 + \frac{A_2}{A_0} u_2 \qquad (1)$$

where l is normalized to be a unit when no impurity exists.

Deviations $\eta_1$ and $\eta_2$ of the bond lengths $A_1$ and $A_2$ from the standard bond length $A_0$ are defined by, $$\eta_1 = (A_1 - A_0)/A_0 \qquad (2)$$

$$\eta_2 = (A_2 - A_0)/A_0 \qquad (3)$$

The deviation $\eta_1$ is negative, but the deviation $\eta_2$ is positive.

The misfit $\epsilon$ of lattice constants is defined by $$|\epsilon| = |l - 1| \qquad (4)$$

Then, $$\epsilon = \eta_2 u_1 + \eta_2 u_2 \qquad (5)$$

As mentioned before, the maximum value of allowable misfit of lattice constants between a substrate and an epitaxial layer or between a seed crystal and a single crystal grown therefrom is about 0.2%. Such contacts are one-dimensional contacts.

However in the case of an impurity-doped single crystal, a small region having impurity atoms contacts with six small regions without impurity atom on up and down, right and left, front and rear boundaries. This is a three-dimensional contact.

Accordingly the requirement of lattice coordination should be far more rigorous. The inventors suppose the requirement of lattice coordination may be on the order of 1/100%.

From the definition of $u_1$ and $u_2$, $$u_1 N_0 = N_1 \qquad (6)$$

$$u_2 N_0 = N_2 \qquad (7)$$

Now $N_0$ will be eliminated together with $N_1$ and $N_2$. Instead of these variables we use the ratios $Z_1$ and $Z_2$ of under-impurity and over-impurity to total impurities.

The definitions of $Z_1$ and $Z_2$ are, $$Z_1 + Z_2 = 1 \quad (8)$$

$$Z_1 = u_1 N_0 / (N_1 + N_2) \quad (9)$$

$$Z_2 = u_2 N_0 / (N_1 + N_2) \quad (10)$$

The ratio of $Z_1$ to $u_1$ or $Z_2$ to $u_2$ is equal to be a ratio of the number of host atoms to the number of impurity atoms. The ratio is supposed to be about 100 to 10000.

If the lattice misfit $\epsilon$ defined by Eq.(5) should be smaller than $1/100\%$, lattice misfit coefficient $\delta$ defined by $Z_1$ and $Z_2$ instead of Eq.(5)

$$\delta = \eta_1 Z_1 + \eta_2 Z_2 \quad (11)$$

should be smaller than a maximun value which may be 1% to 10%.

$Z_1$ and $Z_2$ in Eq.(11) are ratios. The lattice misfit coefficient $\delta$ can be defined by impurity concentrations $x_1$ and $x_2$ (atoms/cm$^3$). Then, $$\delta = \frac{\eta_1 x_1 + \eta_2 x_2}{x_1 + x_2} \quad (12)$$

where $x_1$ is a concentration of an under-impurity, and $x_2$ is a concentration of an over-impurity.

Eq.(12) is equivalent to Eq.(11).

If more than one kind of under-impurities or more than one kind of over-impurities exist in a crystal, summations with regard to the impurities will give us a modified expression of the lattice misfit coefficient $\delta$ $$\delta = \frac{\Sigma \eta_1 x_1 + \Sigma \eta_2 x_2}{\Sigma x_1 + \Sigma x_2} \quad (13)$$

instead of Eq.(12). Here the symbol $\Sigma$ in front of $x_1$ signifies to sum up the variables with regard to all under-impurities. The symbol $\Sigma$ in front of $x_2$ signifies to sum up the variables with regard to all over-impurities.

Eq.(11), Eq.(12) and Eq.(13) lattice are referred to as misfit coefficient equations.

In this invention impurities are used to keep the absolute value of the lattice misfit coefficient smaller than 1%.

Another expression of lattice misfit coefficient $\delta$ is obtained from Eq.(2), Eq.(3) and Eq.(11). Then, $$\delta = (A_1 Z_1 + A_2 Z_2 - A_0)/A_0 \quad (14)$$

Similarly from Eq.(2), Eq.(3) and Eq.(13), fourth expression of $\delta$ is obtained as $$\delta = \left( \frac{\Sigma A_1 x_1 + \Sigma A_2 x_2}{\Sigma x_1 + \Sigma x_2} - A_0 \right) / A_0 \quad (15)$$

The arithmetic average of bond lengths of impurity-host bonds is denoted by $\overline{A}$. $\overline{A}$ is written by $$\overline{A} = A_1 Z_1 + A_2 Z_2 \quad (16)$$

Otherwise, $$\overline{A} = \frac{\Sigma A_1 x_1 + \Sigma A_2 x_2}{\Sigma x_1 + \Sigma x_2} \quad (17)$$

From Eq.(14) and Eq.(16) or from Eq.(15) and Eq.(17), $\delta$ is simply given by $$\delta = (\overline{A} - A_0)/A_0 \quad (18)$$

From Eq.(18), the lattice misfit coefficient $\delta$ is a quotient of the difference between the arithmetic average of impurity-bond lengths and the standard bond length divided by the standard bond length.

(g) Surmise of Bond Lengths

The bond lengths $A_0$, $A_1$ and $A_2$ are the variables depending upon the impurity concentrations. It can be safely assumed that the standard bond length $A_0$ between host elements is equal to the normal standard bond length between host elements in a host crystal without impurity.

However $A_1$ and $A_2$ cannot easily be surmised.

Then the bond lengths $A_1$ and $A_2$ are replaced by more definite and measurable bond lengths $a_1$ and $a_2$, which are defined as bond lengths between an impurity atom and a host atom in a pure single crystal of groups III-V comprising only the elements which are the same as the impurity element and the host element to be coupled with it.

The bond lengths $a_1$ and $a_2$ are definite and known in many cases. But $a_1$ and $a_2$ are not equal to $A_1$ and $A_2$.

Pure bond lengths $a_1$ and $a_2$ will be now explained. For example, the bond length of Ga-As in a GaAs single crystal is 2.44 Å. The bond length of In-As in an InAs single crystal is 2.62 Å.

In this case, the impurity bond length $A_2$ of In-As in a GaAs host crystal shall be replaced by the pure bond length $a_2$ (2.62 Å) of In-As in an InAs crystal.

By these replacements, the lattice misfit coefficient $\delta$ defined by Eq.(14)–Eq.(18) can be calculated.

The bond length of Ga-As in a GaAs crystal is 2.44 Å. The bond length of In-P in an InP crystal is 2.54 Å. The bond length of In-As in an InAs crystal is 2.62 Å. The bond length of Ga-P in a GaP crystal is 2.36 Å.

Similarly, 1.95 Å is used for a Ga-N bond, 2.07 Å for a B-As bond, 2.63 Å for a Ga-Sb bond, and 2.8 Å for an In-Sb bond.

These are the bond lengths concerning isoelectronic impurities. But with regard to anisoelectronic impurities, e.g. Si, Zn, Cr, Sn or S, the bond lengths between an impurity atom and a host atom can be surmised in the same way.

To distinguish the electronic property of impurities, the bond length between an isoelectronic impurity and a host atom are signified by "a", and the bond length between an anisoelectronic impurity and a host atom by "b".

In any case "a" and "b" are not the real bond lengths in an impurity-doped crystal but the definite tetrahedral bond lengths in a pure two-component crystal consisting of the host element and the impurity element.

For both "a" and "b", the lengths shorter than the standard length $a_0$ will be suffixed with "1", and lengths longer than the standard length $a_0$ will be suffixed with "2".

Table (1) shows the bond lengths in Å unit of two-component crystals comprising elements of groups III, V and elements of anisoelectronic impurities to the crystals of groups III-V.

The region enclosed by a double frame in Table (1) shows the bond lengths between atoms belonging to groups III and V. In this specification these bond lengths will be represented by $a_0$, $a_1$ or $a_2$.

The region out of the double frame shows the bond lengths between an atom of groups III or V and an anisoelectronic impurity. These bond lengths will be represented by $b_1$ or $b_2$.

The numeral on a cross point of horizontal line and a vertical column shows the bond length between two atoms which are captioned in the line or the column in a pure two-component crystal.

The replacement of "A" with "a" and "b" enables calculation of the arithmetic average of bond lengths between an impurity atom and a host atom according to Eq.(17).

TABLE (1)

Bond lengths of two-component crystals comprising elements of groups III, V and elements of anisoelectronic impurities to the crystals of groups III-V (in Å unit)

|    | N    | P    | As   | Sb   | S    |
|----|------|------|------|------|------|
| B  | —    | 1.96 | 2.07 | —    | —    |
| Al | —    | 2.36 | —    | —    | —    |
| Ga | 1.95 | 2.36 | 2.44 | 2.63 | 2.30 |
| In | 2.15 | 2.54 | 2.62 | 2.80 | 2.48 |
| Si | —    | 2.27 | 2.35 | —    | —    |
| Zn | —    | 2.41 | 2.49 | —    | —    |
| Cr | —    | —    | 2.36 | —    | —    |
| Sn | —    | 2.50 | 2.58 | —    | —    |

In this invention one or more than one isoelectronic impurities and one anisoelectronic impurity should be doped into a single crystal of groups III-V. One impurity should be an under-impurity. The other impurity should be an over-impurity. There are two possible cases.

Case (1): Isoelectronic under-impurities and an anisoelectronic over-impurity should be doped.

The arithmetic average "$\bar{a}$" of bond lengths is given by $$\bar{a} = \frac{\Sigma a_1 x_1 + b_2 y_2}{\Sigma x_1 + y_2} \tag{19a}$$

where "$a_1$" is a bond length between an isoelectronic under-impurity and a host atom, and $x_1$ is a concentration of the isoelectronic under-impurity. $\Sigma$ signifies a summation with regard to all isoelectronic impurities, if more than one isoelectronic impurities are doped.

"$b_2$" is a bond length between an anisoelectronic over-impurity and a host atom. "$y_2$" is a concentration of the anisoelectronic over-impurity.

Case (2): Isoelectronic over-impurities and an anisoelectronic under-impurity should be doped.

The arithmetic average "$\bar{a}$" of bond lengths is given by $$\bar{a} = \frac{b_1 y_1 + \Sigma a_2 x_2}{y_1 + \Sigma x_2} \tag{19b}$$

where "$b_1$" is a bond length between an anisoelectronic under-impurity and a host atom, and "$y_1$" is a concentration of the anisoelectronic under-impurity. "$a_2$" is a bond length between an isoelectronic over-impurity and a host atom. "$x_2$" is a concentration of the isoelectronic over-impurity.

By using the impurity ratios "Z" of the concentrations "x", another equivalent expression is obtained like Eq.(16) of arithmetic averages "$\bar{a}$" of bond lengths, $$\bar{a} = \Sigma a_1 Z_1 + b_2 Z_2 \tag{20a}$$

for case (1), or $$\bar{a} = b_1 Z_1 + \Sigma a_2 Z_2 \tag{20b}$$

for case (2).

The lattice misfit coefficient $\delta$ is given by $$\delta = \left( \frac{\Sigma a_1 x_1 + b_2 y_2}{\Sigma x_1 + y_2} - a_0 \right) / a_0 \tag{21a}$$

for case (1), or $$\delta = \left( \frac{b_1 y_1 + \Sigma a_2 x_2}{y_1 + \Sigma x_2} - a_0 \right) / a_0 \tag{21b}$$

for case (2) instead of Eq.(15).

SUMMARY OF THE INVENTION

This invention requires that the concentration $x_1$ or $x_2$ of isoelectronic impurities should be more than $10^{18}$ atoms/cm$^3$ and the absolute value of the lattice misfit coefficient $\delta$ should be smaller than 0.01, namely $$-0.01 \leq \delta \leq 0.01 \tag{22}$$

The requirement of Inequality (22) is that the arithmetic average $\bar{a}$ of bond lengths should not differ from the standard bond length $a_0$ by more than 1%.

By using the bond lengths $a_1$, $b_1$ or $a_2$, $b_2$ and the standard bond length $a_0$ the deviations $\eta_1$ and $\eta_2$ are defined by $$\eta_1 = (a_1 - a_0)/a_0 \tag{23a}$$

for case (1), or $$\eta_1 = (b_1 - a_0)/a_0 \tag{23b}$$

for case (2), and $$\eta_2 = (a_2 - a_0)/a_0 \tag{24a}$$

for case (2), or $$\eta_2 = (b_2 - a_0)/a_0 \tag{24b}$$

for case (1), instead of Eq.(2) and Eq.(3).

According to these definitions, $\delta$ can be calculated by using Eq.(11), Eq.(12) or Eq.(13).

$\eta_1$ is negative. $\eta_2$ is positive. In the definitions (23) and (24) of $\eta_1$ and $\eta_2$, "a" and "b" are used in common. However in this invention one of the isoelectronic impurity (or impurities) or an anisoelectronic impurity should be an over-impurity, and the other should be an under-impurity. Therefore in any case the bond lengths "$a_1$" and "$b_1$" do not coexist. There is no possibility to confuse the bond lengths "a" and "b".

From Table (1), if a host crystal is identified, practical numerical values can be assigned to the standard bond length "$a_0$", the bond length "$a_1$" or "$b_1$" related to under-impurities and the bond length "$a_2$" or "$b_2$" related to over-impurities.

"a" is a bond length between an isoelectronic impurity and a host atom in a pure two-component crystal consisting of the elements which are the same as the host atom and the impurity. A bond length which is shorter than $a_0$ is "$a_1$". Another bond length which is longer than $a_0$ is "$a_2$". These are definitions.

"b" is a bond length between an anisoelectronic impurity and a host atom in a pure two-component crystal consisting of the elements same with the host atom and the impurity. A bond length which is shorter than $a_0$ is "$b_1$". Another bond length which is longer than $a_0$ is "$b_2$". These are definitions also.

Table (2) shows the tetrahedral covalent bond lengths $a_0$, $a_1$, $b_1$, $a_2$, $b_2$ in Å unit and the deviations $\eta_1$ (negative) or $\eta_2$ (positive) by percentage with regard to host crystals and impurities doped therein.

TABLE (2)

Tetrahedral covalent bond lengths and deviations in compound semiconductors

| Host Crystal | impurity | Tetrahedral Bond | Bond length (Å) | $\eta_1$, $\eta_2$ (%) |
|---|---|---|---|---|
| GaAs | — | Ga—As | $a_0 = 2.44$ | — |
|  | B | B—As | $a_1 = 2.07$ | −15.2 |
|  | In | In—As | $a_2 = 2.62$ | +7.4 |
|  | Sb | Ga—Sb | $a_2 = 2.63$ | +7.8 |
|  | °Si | Si—As | $b_1 = 2.35$ | −3.7 |
|  | °Zn | Zn—As | $b_2 = 2.49$ | +2.0 |
|  | °Cr | Cr—As | $b_1 = 2.36$ | −3.3 |
| InP | — | In—P | $a_0 = 2.54$ | — |
|  | Ga | Ga—P | $a_1 = 2.36$ | −7.1 |
|  | As | In—As | $a_2 = 2.62$ | +3.1 |
|  | °Zn | Zn—P | $b_1 = 2.41$ | −5.1 |
|  | °S | In—S | $b_1 = 2.48$ | −2.4 |
|  | °Sn | Sn—P | $b_1 = 2.50$ | −1.6 |
| InAs | — | In—As | $a_0 = 2.62$ | — |
|  | Ga | Ga—As | $a_1 = 2.44$ | −6.9 |
|  | P | In—P | $a_1 = 2.54$ | −3.1 |
|  | Sb | In—Sb | $a_2 = 2.80$ | +6.9 |
|  | °Zn | Zn—As | $b_1 = 2.49$ | −5.0 |
|  | °S | In—S | $b_1 = 2.48$ | −5.3 |
|  | °Sn | Sn—As | $b_1 = 2.58$ | −1.5 |
| GaP | — | Ga—P | $a_0 = 2.36$ | — |
|  | B | B—P | $a_1 = 1.96$ | −16.9 |
|  | As | Ga—As | $a_2 = 2.44$ | +3.4 |
|  | In | In—P | $a_2 = 2.54$ | +7.6 |
|  | °Zn | Zn—P | $b_2 = 2.41$ | +2.1 |
|  | °Si | Si—P | $b_1 = 2.27$ | −3.8 |
|  | °S | Ga—S | $b_1 = 3.30$ | −2.5 |

(Round marks denote anisoelectronic impurities)

This invention proposes a semiconductor single crystal of groups III–V doped with one or more than one isoelectronic under-impurities and one anisoelectronic over-impurity, or doped with one anisoelectronic under-impurity and one or more than one isoelectronic over-impurities, wherein the arithmetic average "$\bar{a}$" of the bond lengths between the isoelectronic or anisoelectronic impurity and the corresponding host atom differs from the standard bond length "$a_0$" between host atoms of the crystal by less than plus or minus one percent, and the concentration of isoelectronic impurity in the crystal is more than $10^{18}$ atoms/cm$^3$.

From Table (2), the deviations $\eta_1$ and $\eta_2$ for any single isoelectronic impurity are larger than 3%. The deviations $\eta_1$ and $\eta_2$ for any single anisoelectronic impurity are larger than 1.6%.

In this invention at least one over-impurity ($\eta_2 > 0$) and at least one under-impurity ($\eta_1 < 0$) should be doped in a single crystal in order to confine the difference between the arithmetic average "$\bar{a}$" and the standard length "$a_0$" within plus or minus 2%. In other words this invention requires the absolute value of the lattice misfit coefficient $\delta$ be reduced to less than 1% by double doping of under- and over-impurities.

The reason why the concentration of isoelectronic impurities should be bigger than $10^{18}$ atoms/cm$^3$ is that the concentration is a lower limit enough to reduce the EPD in a doped single crystal.

Even if $\delta$ is 1%, a lattice misfit of 1% does not appear in real crystal lattices.

The lattice misfit coefficient "$\delta$" or the arithmetic average "$\bar{a}$" of bond lengths does not correspond to any concrete physical values.

As mentioned before, when a crystal was imagined to be divided into many small regions, lattice misfits would appear on the boundaries of neighboring regions. The imaginary lattice misfits are signified by "$\epsilon$" defined by Eq.(1) and Eq.(2) or Eq.(5).

The lattice misfit coefficient "$\delta$" is the quotient of the product of "$\epsilon$" and impurity concentration ($N_1 + N_2$) divided by host atom number $N_0$.

Therefore even if "$\delta$" was kept constant, the lattice misfit coefficient $\epsilon$ would increase when the impurity concentration was raised. However because "$\delta$" should be confined within plus or minus 1% according to this invention, the imaginary lattice misfit "$\epsilon$" does not increase much.

Furthermore it is best to converge "$\delta$" to zero, when the impurity concentration is large.

DETAILED DESCRIPTION OF EMBODIMENTS

Figure 1:
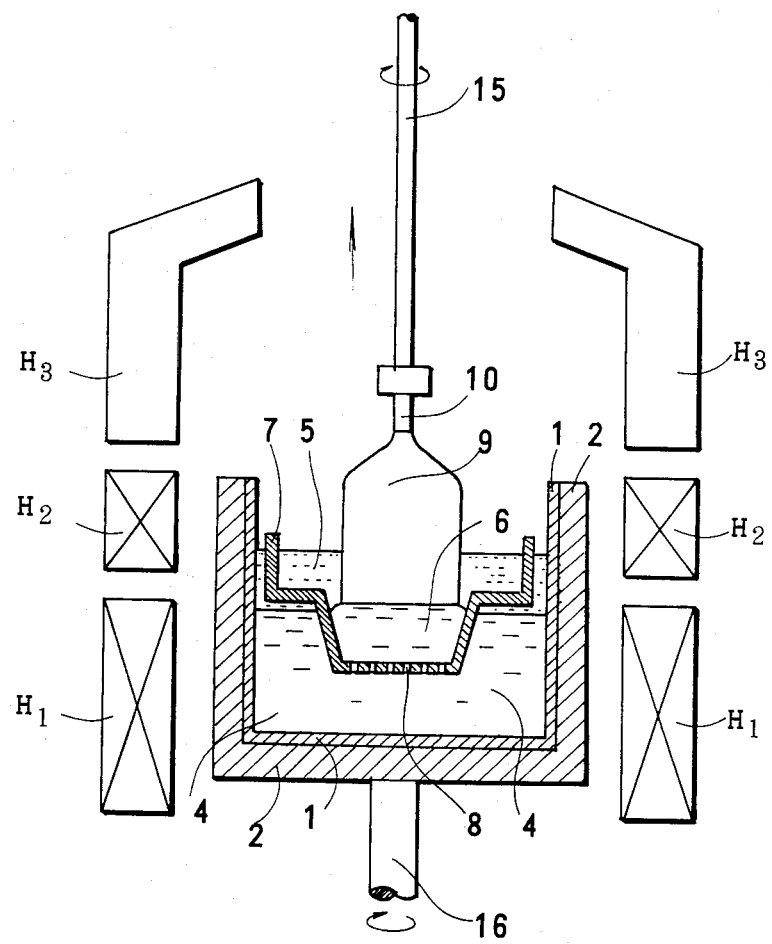
FIG. 1 is a vertically-sectioned view of a liquid encapsulated Czockralski apparatus for growing a single crystal of double crucible type having a floating crucible.

This invention is equally applicable to LEC method and HB method. FIG. 1 shows a three-temperature LEC apparatus for growing a single crystal as an example.

A crucible (1) made from some pertinent material, e.g. PBN (pyrolitic boron nitride) is sustained by a graphite susceptor (2). The material melt contains host compounds and impurities; this melt is referred to here as compound melt. The compound melt is divided in two parts by a floating crucible (7).

Then to distinguish the compound melt, the melt in the floating crucible (7) is referred to as an inner melt (6) and the melt out of the floating crucible (7) an outer melt (7).

The floating crucible (7) has small holes (8) on the bottom wall. The outer melt (4) goes through the small holes (8) into the inner melt (6).

A liquid encapsulant (5) covers both inner melt (6) and outer melt (4).

A seed crystal (10) is fixed at the bottom end of an upper shaft (15). A single crystal (9) is pulled up by the seed crystal (10) in succession. A lower shaft (16) supports the susceptor (2).

Heating apparatus consists of three heaters arranged in a vertical direction. A lower heater (H1), a middle heater (H2) and an upper heater (H3) can be controlled independently.

An LEC method using a floating crucible was proposed by Japanese Patent Laying Open No. 104796/81. In the improved method the impurity with a distribution coefficient less than 1 should be added in the floating crucible and the impurity with a distribution coefficient more than 1 should be added out of the floating crucible. Then when the compound melt was reduced in the progress of crystal growth, the impurity concentration in the floating crucible hardly changes.

The three-temperature LEC method was a novel method which was disclosed for the first time in Japanese Patent Application No. 154771/83. By the improved method, the temperature gradient in a liquid encapsulant $B_2O_3$ can be 30° to 50° C./cm and the temperature gradient in an upper space can be lower than 20° C./cm in the case of the crystal growth of GaAs.

Thus the apparatus shown in FIG. 1 is a very exquisite LEC apparatus.

However this invention can be applied to conventional LEC methods as well as HB methods. The apparatus of FIG. 1 is only an example of LEC apparatus.

(a) EMBODIMENT I (InP: As, S)

An InP single crystal doped with As as isoelectronic over-impurity and S as anisoelectronic under-impurity is grown along <100> direction by an LEC method. Double crucibles with a crucible and a floating crucible as shown in FIG. 1 is used. The floating crucible (7) is made from PBN. The outer crucible (1) is a quartz crucible.

| Materials are: | |
|---|---|
| InP polycrystal ($W_0$) | 1000 g (6.859 mol) |
|    in floating crucible (w) | 150 g (1.029 mol) |
|    out of floating crucible (W) | 850 g (5.830 mol) |
| $B_2O_3$(fully-dehydrated) | 150 g (liquid encapsulant) |
| Impurities are: | |
| InAs (in floating crucible) | 91 mg |
| (weight of As therein | 36 mg) |
| InS (in floating crucible) | 78 mg |
| (weight of S therein | 16 mg) |

The distribution coefficients k of As and S in InP melt and solid are;

$k(As) = 0.4$ $k(S) = 0.5$

Both impurities As and S are added into the floating crucible, because the distribution coefficients are less than 1.

An InP single crystal is grown up from the materials by the improved LEC method. The conditions of crystal growth are;
temperature of melt: 1100° C.;
pressure of nitrogen gas: 49 atm;
growing speed: 7 mm/Hr;
rotation of upper shaft; 3 to 20 RPM;
rotation of lower shaft; 5 to 30 RPM.

The density of InP is denoted by $\rho$ (4.787 g/cm³), and the charged amount of InP poly-crystal by w (or W). The volume of the charged InP is w/$\rho$ (or W/$\rho$).

"m" is the doping weight of impurity. "M" is the atomic weight of the impurity. Then the impurity is doped by (m/M) mol. The number of atoms in 1 mol is equal to the Avogadro's number $L_0$(6.02×10²³ atoms).

"k" denotes the distribution coefficient of the impurity. "m" g of impurity is added into "w" g of charged polycrystal. Then the materials are heated and molten.

In this case, the impurity concentration "n" of a crystal grown from the melt is $$n = \frac{km\rho L_0}{Mw} \qquad (25)$$

Substituting k=0.4, m=36 mg, M=74.922, $\rho$=4.787 g/cm³, $L_0$=6.02×10²³ and w=150 g (in the floating crucible) into Eq.(25), the concentration of As is obtained, $n(As) = 3.7 \times 10^{18}$ cm⁻³

This is an initial concentration of As. In the case of conventional LEC methods, the concentration would be rising according to the progress of growth, because "k" is less than 1.

However in the improved LEC method using floating crucible, the concentration scarcely changes. It slightly diminishes on the contrary. Similarly substituting k=0.5, m=16 mg, and M=32 into Eq.(25), the concentration of S is $n(S) = 4.8 \times 10^{18}$ cm⁻³

A single crystal is obtained of 2 inches in diameter. The weight of the crystal was 900 g. Slicing the single crystal into many wafers, the wafers were etched and counted EPD on the wafer surfaces. Because EPD is excessively large at the periphery of the wafers, the EPD was averaged on the wafers except the periphery of 5 mm width. The results were, Average EPD at top end = 2000 cm⁻²

Average EPD at back end = 1500 cm⁻²

Usually EPD is lower at the top end but higher at the back end of a crystal grown by a conventional LEC method. But these results signify an inverse tendency. Furthermore the crystal was fully single until the back end. There is no impurity segregation on a surface near the back end.

The reason is because the impurities As and S became diluted and the optimum concentration was realized near the back end of the crystal according to the progress of growth.

The arithmetic average of bond lengths was calculated.

| (i) over-impurity | In—As | $a_2 = 2.62$ Å |
|---|---|---|
| | n(As) | $x_2 = 3.7 \times 10^{18}$ cm⁻³ |
| (ii) under-impurity | In—S | $b_1 = 2.48$ Å |
| | n(S) | $y_1 = 4.8 \times 10^{18}$ cm⁻³ |

From the values and Eq.(21b), $\bar{a} = 2.54$ Å

Then the arithmetic average of bond lengths is equal to the standard bond length $a_0=2.54$ Å of In-P bond in a host crystal in this case.

These calculations are based on the calculated initial concentrations of S and As.

The concentrations of S and As were measured at many points in the grown single crystal and the arithmetic average $\bar{a}$ was calculated at the measured points. The results showed $$-0.3\% < \delta = (\bar{a}_0 - a_0)/a_0 < +0.2\%$$

The absolute value of $\delta$ is always less than 1 %.

Figure 2:
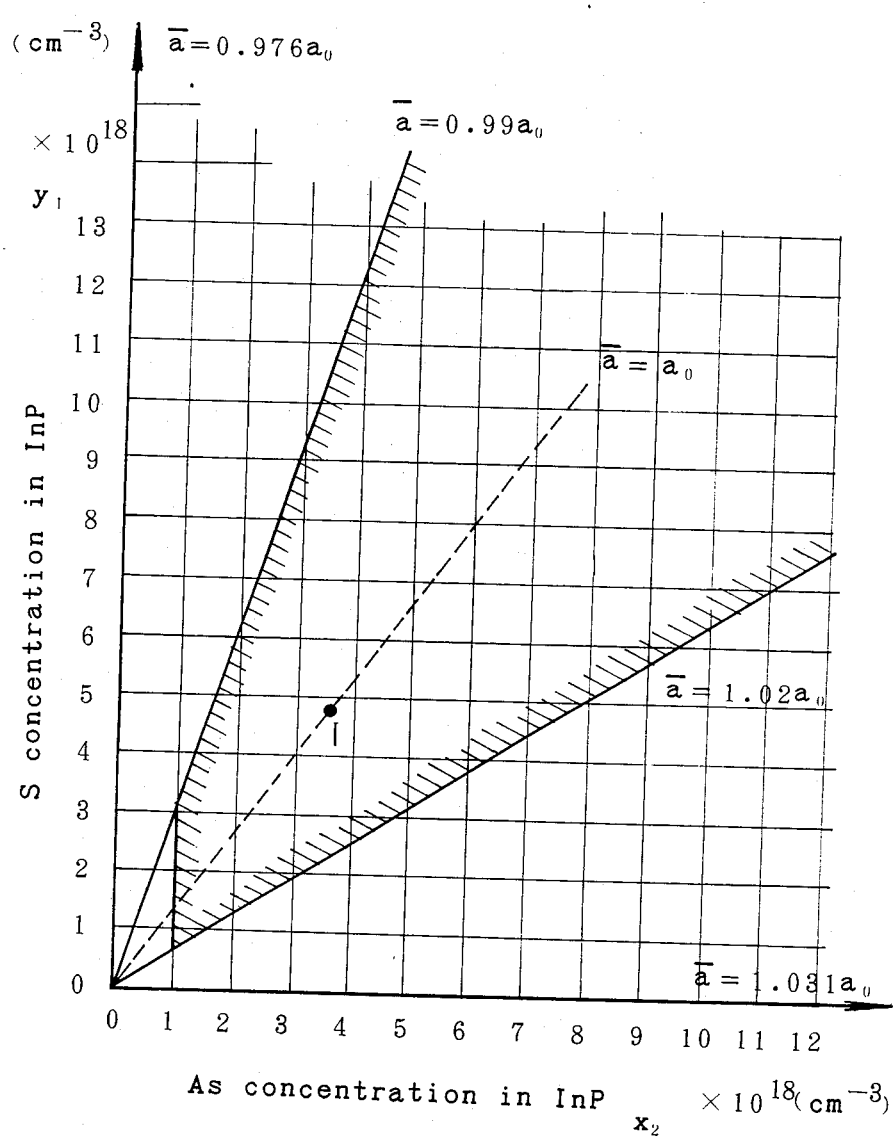
FIG. 2 is a graph showing the preferable region of impurity concentrations satisfying the requirement of the invention, wherein InP is the host crystal, and As and S are the impurities to be doped.

FIG. 2 is a graph showing a preferable region of As- and S-concentrations in the InP host crystal defined by this invention. The abscissa denotes As-concentration $x_2$ in the InP crystal.

The ordinate denotes S-concentration $y_1$ in the InP crystal.

A group of the single crystals which have a common arithmetic average "$\bar{a}$" is signified by a line crossing at the original point. In FIG. 2 three lines which show the concentrations of the groups wherein "$\bar{a}$" is equal to $a_0$, $0.99a_0$ or $1.01a_0$.

The region enclosed by the lines of $\bar{a}=0.99a_0$, $\bar{a}=1.01a_0$ and $x_2=1\times10^{18}$ cm$^{-3}$ shows the impurity concentrations defined by this invention. The black dot corresponds to the embodiment I.

(b) EMBODIMENT II (GaAs: In, Si )

An isoelectronic over-impurity In and an anisoelectronic under-impurity Si are doped into a GaAs host crystal.

Instead of an LEC method a three-temperature horizontal Bridgman method (3T-HB method) was used. The direction of crystal growth is <111>.

The detail of 3T-HB method is clarified in Japanese Patent Publication No. 19637/83.

Materials charged in a boat are Ga and As, or GaAs polycrystal and impurities. The weight of host material converted into GaAs is 7500 g. Impurities are doped as much as the concentrations at the front end of a grown crystal shall be $n(\text{In}) = 1.5 \times 10^{18}$ cm$^{-3}$ $n(\text{Si}) = 3.2 \times 10^{18}$ cm$^{-3}$ Distribution coefficients for In and Si are $k(\text{In}) = 0.1$ $k(\text{Si}) = 0.14$ The conditions of crystal growth are;
boat: quartz (SiO$_2$);
temperature of melt: 1250° C.;
vapor pressure of As: 1.03 atm;
length of boat: 1000 mm;
charged amount of GaAs: 7500 g;
speed of crystal growth: 3 mm/Hr;
cooling rate after growth: 50° C./Hr to 100° C./Hr.
The lengths of tetrahedral covalent bonds are;

Ga-As $a_0 = 2.44$ Å

In-As $a_2 = 2.62$ Å

Si-As $b_1 = 2.35$ Å

Then $$\bar{a} = \frac{2.35y_1 + 2.62x_2}{y_1 + x_2} \quad (26)$$

where $x_2$ is In-concentration and $y_1$ is Si-concentration.

This invention requires that "$\bar{a}$" should not differ from "$a_0$" by more than ±1%.

The requirements of the invention are $$1.360x_2 \leq y_1 \leq 3.116x_2 \quad (27)$$

$$10^{18} \leq x_2 \quad (28)$$

The best lattice coordination condition is $\bar{a}=a_0$. In this case the condition shall be realized by $$y_1 = 2x_2 \quad (29)$$

Impurity concentrations are kept uniform in a melt, because the melt flows freely in a boat. However if the distribution coefficient is not 1, the concentration of the impurity changes as a function of solidification rate "g" which is the quotient of the weight solidified (crystallized) part divided by the total weight of material.

The change of the impurity concentration n(g) is given by $$n(g) = n_0(1-g)^{k-1} \quad (30)$$

where $n_0$ is an initial impurity at the front end of a crystal.

Because S and In have different distribution coefficients "k", the changing rates of the concentrations of S and In as a function of solidification ratio "g".

Figure 3:
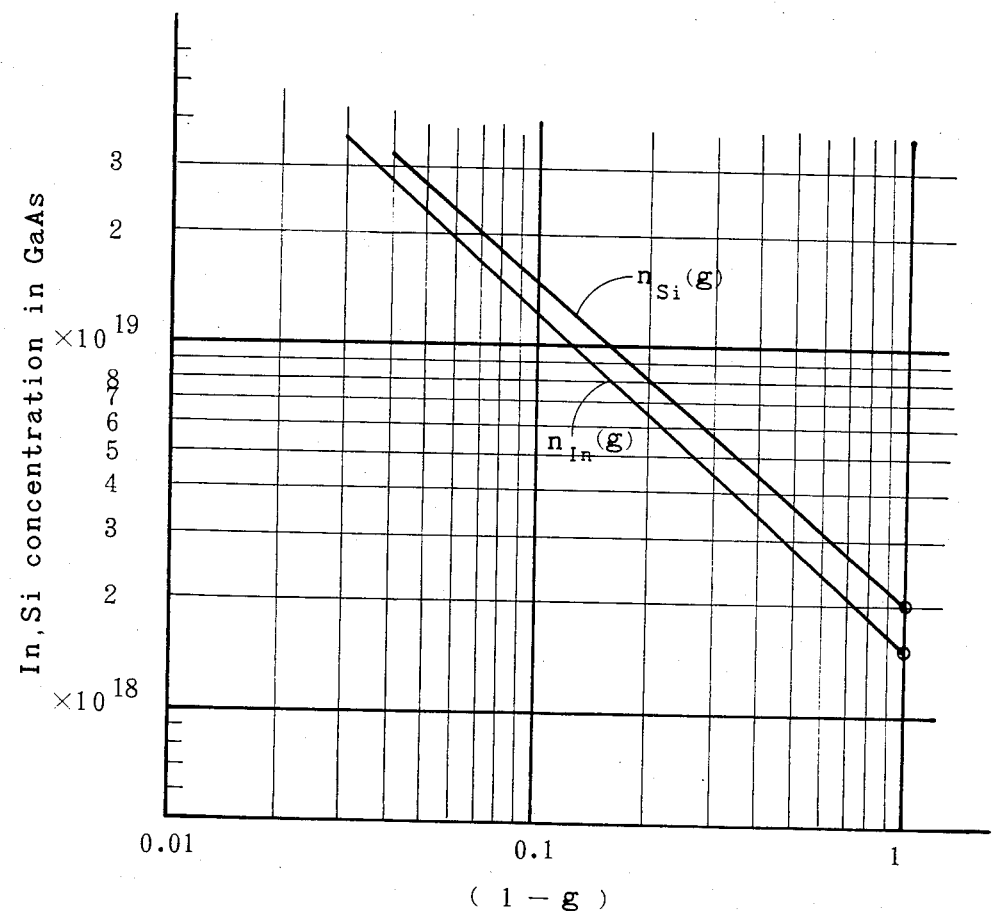
FIG. 3 is a graph showing the changes of the concentration of impurities In and Si doped into a GaAs host crystal in the HB method as function of the solidification ratio "g".

FIG. 3 shows the impurity concentrations $n_{In}(g)$ and $N_{Si}(g)$ as a function of $(1-g)$ according to Eq.(30), wherein the distribution coefficients of Si and In are assumed to be 0.14 and 0.1.

The right side of the graph corresponds to front end (g=0) of a crystal.

As mentioned before, the impurity concentrations at the front end (near a seed crystal) are $n(\text{In}) = 1.5 \times 10^{18}$ cm$^{-3}$ $n(\text{Si}) = 3.2 \times 10^{18}$ cm$^{-3}$ At the front end the arithmetic average "$\bar{a}$" is $\bar{a} = 2.436$ Å

At a back end (at a point where g=0.8 or $(1-g)=0.2$), the impurity concentrations are $n(\text{In}) = 6.4 \times 10^{18}$ cm$^{-3}$ $n(\text{Si}) = 12.8 \times 10^{18}$ cm$^{-3}$ Then the arithmetic average "$\bar{a}$" is $\bar{a} = 2.44$ Å at the back end.

The single crystal ingot was grown along <111> direction. The ingot was sliced in a slanting plane to obtain (100) wafers. The wafers were cut into circular wafers. Etching the wafers by some pertinent etchant, EPD was measured as on the (100) surface of the wafers. Except on the periphery of 5 mm width, the averages of EPD were: 550 cm$^{-2}$ at front end; 350 cm$^{-2}$ at back end.

Within the region (g=0 to 0.8), no segregation of In nor segregation of Si occurred.

(c) OTHER IMPURITY DOPINGS

So far two embodiments have been clarified: InP (doped with As/S) by LEC method; and GaAs (doped with In/Si) by HB method.

Besides the examples various single crystals have been made with different impurity concentrations. When the lattice misfit coefficient δ exceeds over ±1%, cell structures, impurity segregation or other lattice defects are apt to happen like single-impurity doped crystal e.g. a GaAs doped with As or In alone.

Besides the mentioned example there are other preferable impurity dopings based upon this invention. Namely: HB method: GaAs (In/Sb/Si); HB method: GaAs (In/Cr); LEC method: InP (As/Zn); and LEC method: InP (As/Sn).

The impurities for which the impurity hardening effect has been confirmed are as follows, for GaAs: In, B, Sb, N, Si, Al;
for InP: Ga, As, Zn, S, Ge;
for GaP: Si, B, Al, S.

Accordingly in order to reduce and to make uniform the EPD and to endow desirable property (semi-insulating, n-type or p-type semiconductor), one or more than one isoelectronic impurities should be doped with impurity hardening effect and one anisoelectronic impurity which decides the electronic property of the host crystal.

(d) GENERALIZATION

The requirement of the invention can be expressed in simplified form as, $$\Sigma x \geq 10^{18} \quad (31)$$

$$-0.01 \leq \frac{\Sigma \eta x + \eta y}{\Sigma x + y} \leq 0.01 \quad (32)$$

where x and y should be alternatively suffixed with the numerals "1" or "2".

Especially in the case of two impurities, in order to realize the best condition (δ=0), the impurity concentrations should be determined by $$(-\eta_1)x_1 = \eta_2 y_2 \quad (33)$$

or $$(-\eta_1)y_1 = \eta_2 x_2 \quad (34)$$

Inequality (32) requires the ratio $x_1/y_2$ or $y_1/x_2$ of the impurity concentrations should exist within a certain extent in the case of two impurities.

To simplify the expressions, the absolute values of percentages of the deviations $\eta_1$ (negative) and $\eta_2$ (positive) are signified by by "$K_1$" and "$K_2$".

Hence $$-100\eta_1 = K_1 \quad (35)$$

$$100\eta_2 = K_2 \quad (36)$$

The concentration ratio "R" is defined $$R = \frac{x_1}{y_2} \text{ or } \frac{y_1}{x_2} \quad (37)$$

The requirement of the invention is simply expressed by $$\frac{K_2 - 1}{K_1 + 1} \leq R \leq \frac{K_2 + 1}{K_1 - 1} \quad (38)$$

Here the concentration ratio R is defined as a quotient of under-impurity concentration $x_1$ or $y_1$ divided by over-impurity concentration $x_2$ or $y_2$ in Eq.(37). But it is also allowable to define the ratio R by the reciprocal of Eq.(37).

The extent of the applicability of the invention will now be clarified in the case of changing impurity concentrations.

If the distribution coefficient of the impurity is not 1, the impurity concentration is changing in the crystal growth by the solidification rate "g" according to Eq.(30) both in HB methods and conventional LEC methods.

In this invention at least two impurities are doped in a host crystal. The impurity ratio "R" also changes during the crystal growth.

Hence even if the impurity ratio "R" exists in an optimum range at the beginning of the crystal growth (g=0), it is probable that the ratio "R" may deviate from the optimum range as the crystal growth progresses.

To prevent the deviation of R, the ratio R is made to satisfy the Inequality (38), while "g" varies from 0 to $g_m$ ($g_m < 1$).

First Eq.(30) will be clarified. This equation appeared in the Willardson's U.S. Patent aforementioned.

"L" denotes the weight of compound melt. "m" denotes the weight of impurity doped therein. At the solid-liquid interface when an infinitesimal part dL of melt is solidified, infinitesimal impurity "dm" is included in "dL".

At the solid-liquid interface, the impurity concentration of newly-solidified part is a product of the impurity concentration in melt and the distribution coefficient.

$$\frac{dm}{dL} = k \frac{m}{L} \quad (39)$$

This is a differential equation of separable variable type. This is easily solved. The solution is $$m = (\text{const}) \times L^k \quad (40)$$

Namely $$m = m_0 \left(\frac{L}{L_0}\right)^k \quad (41)$$

where $m_0$ and $L_0$ are initial values of m and L. The impurity concentration n of the solidified part is defined by $$n = k \frac{m}{L} = \frac{dm}{dL} \quad (42)$$

The melt weight L is represented by $$L = L_0(1-g) \quad (43)$$

The initial impurity concentration $n_0$ is given by $$n_0 = \frac{km_0}{L_0} \quad (44)$$

Thus the impurity concentration "n" becomes $$n(g) = n_0(1-g)^{k-1} \quad (45)$$

as a function of g. Eq.(45) holds for any impurities as long as the concentrations are small.

"$N_2$" and "$N_1$" denote the initial concentrations of the over-impurity and the under-impurity. "$k_1$" and "$k_2$" denote the distribution coefficients of the over-impurity and the under-impurity.

The requirement of the invention should be satisfied, as long as $$\frac{K_2 - 1}{K_1 + 1} \leq \frac{N_1(1-g)^{k_1-k_2}}{N_2} \leq \frac{K_2 + 1}{K_1 - 1} \quad (46)$$

Another expression of Inequality (46) will be derived now. "$m_2$" and "$m_1$" denote initial charged weights of the over-impurity and the under-impurity. "$M_2$" and "$M_1$" are atomic weights of the over-impurity and the under-impurity. From Eq.(44)

$$\frac{N_1}{N_2} = \frac{k_1 m_1 M_2}{k_2 m_2 M_1} \quad (47)$$

Instead of Inequality (46) the same requirement is given by $$\frac{K_2 - 1}{K_1 + 1} \leq \frac{k_1 m_1 M_2}{k_2 m_2 M_1}(1-g)^{k_1-k_2} \leq \frac{K_2 + 1}{K_1 - 1} \quad (48)$$

The requirement is assumed satisfied while g varies from 0 to $g_m$. Preferable conditions will now be considered in two cases according to the inequality between $K_1$ and $K_2$.

Case (1) If $k_1 \geq k_2$

At the beginning of the crystal growth the inequality $$\frac{m_1}{m_2} \leq \frac{(K_2 + 1)k_2 M_1}{(K_1 - 1)k_1 M_2} \quad (49)$$

should be satisfied.

"$g_m$" is defined as an upper limit of probable solidification ratio "g". "$g_m$" is given by $$g_m = 1 - \left( \frac{m_2 k_2 (K_2 - 1) M_1}{m_1 k_1 (K_1 + 1) M_2} \right)^{\frac{1}{k_1 - k_2}} \quad (50)$$

As $g_m$ approaches 1, the requirement of the invention will be satisfied in wider scope of the crystal made by the invention.

The upper limit $g_m$ takes the largest value, when the equality holds in the expression (49). Namely the initial ratio of impurities should satisfy the relation $$\frac{m_1}{m_2} = \frac{(K_2 + 1)k_2 M_1}{(K_1 - 1)k_1 M_2} \quad (51)$$

In other words the initial ratio of impurity concentrations are $$\frac{N_1}{N_2} = \frac{K_2 + 1}{K_1 - 1} \quad (52)$$

If these conditions hold, the largest value "$g_{mm}$" of upper limit "$g_m$" is given by $$g_{mm} = 1 - \left( \frac{(K_2 - 1)(K_1 - 1)}{(K_2 + 1)(K_1 + 1)} \right)^{\frac{1}{k_1 - k_2}} \quad (53)$$

For example in the case of InP (As/S), As is the over-impurity and S is the under-impurity. From Table (2), Eq.(35) and Eq.(36), $$K_1 = 2.4, \quad K_2 = 3.1$$

$$k_1 = 0.5, \quad k_2 = 0.4$$

$$M_1 = 32.06, \quad M_2 = 74.92$$

The condition of Eq.(51) is $$\frac{m_1(S)}{m_2(As)} = 1.00$$

The largest value of $g_m$ is $$1 - g_{mm} = 1.7 \times 10^{-7}$$

This result signifies the requirement of the invention is satisfied in nearly full length of the crystal.

In another case of GaAs (In/Si), In is the over-impurity and Si is the under-impurity.

From Table (2), Eq.(35) and Eq.(36), $$K_1 = 3.7, \quad K_2 = 7.4$$

$$k_1 = 0.14, \quad k_2 = 0.1$$

$$M_1 = 28.08, \quad M_2 = 114.82$$

The condition of Eq.(51) is $$\frac{m_1(Si)}{m_2(In)} = 0.543$$

From Eq.(52), the ratio of impurity concentrations is $$\frac{N_1(Si)}{N_2(In)} = 3.1$$

The largest value of $g_m$ is $$1 - g_{mm} = 10^{-9}$$

This result signifies the requirement of the invention is satisfied in nearly the full length of the crystal.

Case (2) If $k_1 < k_2$

At the beginning of the crystal growth the inequality $$\frac{m_1}{m_2} \geqq \frac{(K_2 - 1) k_2 M_1}{(K_1 + 1) k_1 M_2} \quad (54)$$

should be satisfied.

The upper limit "$g_m$" of "$g$" is given by $$1 - g_m = \left( \frac{m_1 k_1 M_2 (K_1 - 1)}{m_2 k_2 M_1 (K_2 + 1)} \right)^{\frac{1}{k_2 - k_1}} \quad (55)$$

The upper limit "$g_m$" takes the largest value, when the equality holds in the expression (54). The largest value "$g_{mm}$" is $$1 - g_{mm} = \left( \frac{(K_2 - 1)(K_1 - 1)}{(K_2 + 1)(K_1 + 1)} \right)^{\frac{1}{k_2 - k_1}} \quad (56)$$

The advantages of the invention will be explained.

(1) This invention enables the manufacture of a single crystal of compound semiconductors of groups III-V with very low EPD by LEC methods or HB methods.

(2) Even if the impurity concentrations of a crystal grown by LEC methods are high, the crystal is single in nearly full length by the double doping of this invention.

(3) Because this invention dopes both isoelectronic impurity and anisoelectronic impurity into a host crystal, the freedom to determine the electronic property of the crystal is not confined.

Anisoelectronic impurity determines the electronic property of the crystal. The carrier (electron or hole) density is proportional to the doped anisoelectronic impurity. Even if the doping amount of anisoelectronic impurity is big, a single crystal can be made with low dislocation density because the effect of excess doping of anisoelectronic impurity can be compensated for by excess doping of isoelectronic impurity of a different size.

What we claim is:

1. A single crystal of compound semiconductor of groups III-V with low dislocation density, wherein a host crystal of compound semiconductor of groups III-V is doped with at least on isoelectronic under-impurity and one anisoelectronic over-impurity, or at least one isoelectronic over-impurity and an anisoelectronic under-impurity, wherein the arithmetic average $\bar{a}$ of bond lengths and the standard bond length $a_0$ between host atoms satisfy the inequality:

$$-0.01 \leqq \frac{\bar{a} - a_0}{a_0} \leqq 0.01$$

the arithmetic average of the bond length $\bar{a}$ is defined by:

$$\bar{a} = \frac{\Sigma a_1 x_1 + b_2 y_2}{\Sigma x_1 + y_2}$$

or:

$$\bar{a} = \frac{b_1 y_1 + \Sigma a_2 x_2}{y_1 + \Sigma x_2}$$

where $a_1$ is a tetrahedral covalent bond length between the isoelectronic under-impurity and the host atom in a two-component crystal consisting of elements which are the same as the impurity atom and the host atom, $x_1$ is an impurity concentration of the isoelectronic under-impurity, $b_2$ is a bond length between the anisoelectronic over-impurity and the host atom in a two-component crystal consisting of elements which are the same as the impurity atom and the host atom, $y_2$ is an impurity concentration of the anisoelectronic over-impurity, $b_1$ is a bond length between the anisoelectronic under-impurity and the host atoms in a two-component crystal consisting of elements which are the same as the impurity atom and the host atom, $y_1$ is an impurity concentration of the anisoelectronic under-impurity, $a_2$ is a bond length between the isoelectronic over-impurity and the host atom in a two-component crystal consisting of elements which are the same as the impurity atom and the host atom, $x_2$ is an impurity concentration of the isoelectronic over-impurity and $\Sigma$ signifies the sum of the values with regard to all isoelectronic impurities if more than one isoelectronic impurity is doped, and the total concentrations of the isoelectronic impurities satisfy the inequalities:

$x_1 \geqq 10^{18}$ atoms/cm$^3$ $x_2 \geqq 10^{18}$ atoms/cm$^3$ where the host crystal is an element selected from the group consisting of B, Al, Ga or In, and an element selected from the group consisting of N, P, As or Sb, the isoelectronic impurities are selected from the group consisting of B, Al, Ga, In, N, P, As or Sb, and are other than the elements of the host crystal, the anisoelectronic impurity is an element other than the elements of groups IIIb and Vb, the over-impurities are impurities which are apt to form a bond with one of the host elements that is longer than the bond between the host elements and, the under-impurities are impurities which are apt to form a bond with one of the host elements that is shorter than the bond between the host elements.

2. A single crystal of compound semiconductor as claimed in claim (1), wherein the host crystal is InP, the isoelectronic over-impurity is As, and the anisoelectronic under-impurity is S.

3. A single crystal of compound semiconductor as claimed in claim (1), wherein the host crystal is GaAs, the isoelectronic over-impurity is In, and the anisoelectronic under-impurity is Si.

4. A single crystal of compound semiconductor as claimed in claim (1), wherein the host crystal is GaAs, the anisoelectronic under-impurity is Si, and the isoelectronic over-impurities are In and Sb.

5. A single crystal of compound semiconductor as claimed in claim (1), wherein the host crystal is GaAs, the isoelectronic over-impurity is In, and the anisoelectronic under-impurity is Cr.

6. A single crystal of compound semiconductor as claimed in claim (1), wherein the host crystal is InP, the isoelectronic over-impurity is As, and the anisoelectronic under-impurity is Zn.

7. A single crystal of compound semiconductor as claimed in claim (1), wherein the host crystal is InP, the isoelectronic over-impurity is As, and the anisoelectronic under-impurity is Sn.

8. A single crystal of compound semiconductor as claimed in claim (1), wherein the host crystal is GaP, the isoelectronic under-impurity is B or Al, and the anisoelectronic over-impurity is S.

9. A single crystal of compound semiconductor as claimed in claim (1), wherein the host crystal is GaP, the isoelectronic over-impurity is In, and the anisoelectronic under-impurity is Si.

* * * * *